United States Patent
Brady et al.

(10) Patent No.: US 7,432,121 B2
(45) Date of Patent: Oct. 7, 2008

(54) ISOLATION PROCESS AND STRUCTURE FOR CMOS IMAGERS

(75) Inventors: Frederick Brady, Meridian, ID (US); Inna Patrick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 576 days.

(21) Appl. No.: 11/135,517

(22) Filed: May 24, 2005

(65) Prior Publication Data

US 2006/0270096 A1 Nov. 30, 2006

(51) Int. Cl.
*H01L 21/00* (2006.01)

(52) U.S. Cl. .............. 438/48; 438/510; 438/514; 438/527; 438/529

(58) Field of Classification Search .......... 438/48, 438/510, 514, 527, 529
See application file for complete search history.

(56) References Cited

U.S. PATENT DOCUMENTS

| | | | |
|---|---|---|---|
| 6,218,691 B1 | 4/2001 | Chung et al. | |
| 7,102,184 B2 * | 9/2006 | Rhodes | 257/292 |
| 7,262,110 B2 * | 8/2007 | Jin | 438/424 |
| 2002/0121655 A1 | 9/2002 | Zheng et al. | |
| 2004/0094784 A1 * | 5/2004 | Rhodes et al. | 257/291 |
| 2004/0235215 A1 | 11/2004 | Komori | |
| 2005/0035382 A1 | 2/2005 | Shinohara et al. | |
| 2006/0065896 A1 | 3/2006 | Abe et al. | |

FOREIGN PATENT DOCUMENTS

WO WO 00/21280 4/2000

* cited by examiner

*Primary Examiner*—Phuc T Dang
*Assistant Examiner*—Thanh Y Tran
(74) *Attorney, Agent, or Firm*—Dickstein Shapiro LLP (57) ABSTRACT

A barrier implanted region of a first conductivity type formed in lieu of an isolation region of a pixel sensor cell that provides physical and electrical isolation of photosensitive elements of adjacent pixel sensor cells of a CMOS imager. The barrier implanted region comprises a first region having a first width and a second region having a second width greater than the first width, the second region being located below the first region. The first region is laterally spaced from doped regions of a second conductivity type of adjacent photodiodes of pixel sensor cells of a CMOS imager.

16 Claims, 6 Drawing Sheets

ISOLATION PROCESS AND STRUCTURE FOR CMOS IMAGERS

FIELD OF THE INVENTION

The present invention relates to the field of semiconductor devices and, in particular, to high quantum efficiency CMOS image sensors.

BACKGROUND OF THE INVENTION

Figure 1:
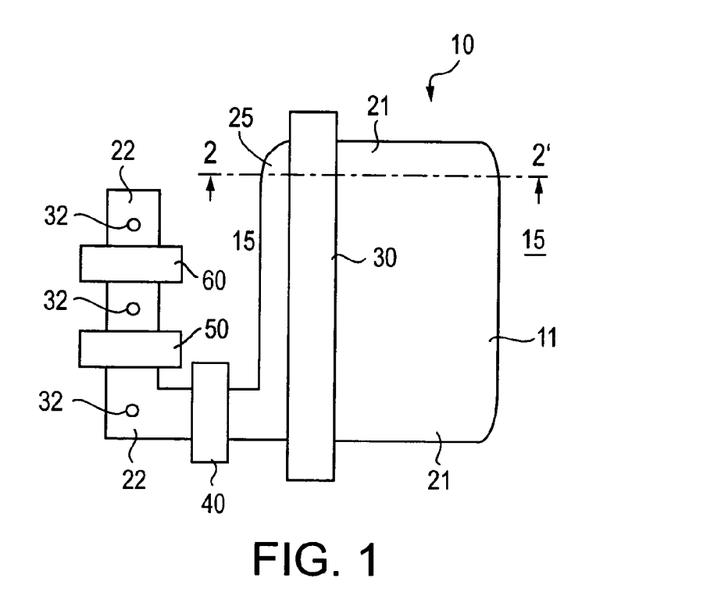
FIG. 1 is a top plan view of an exemplary conventional CMOS image sensor pixel.
Figure 2:
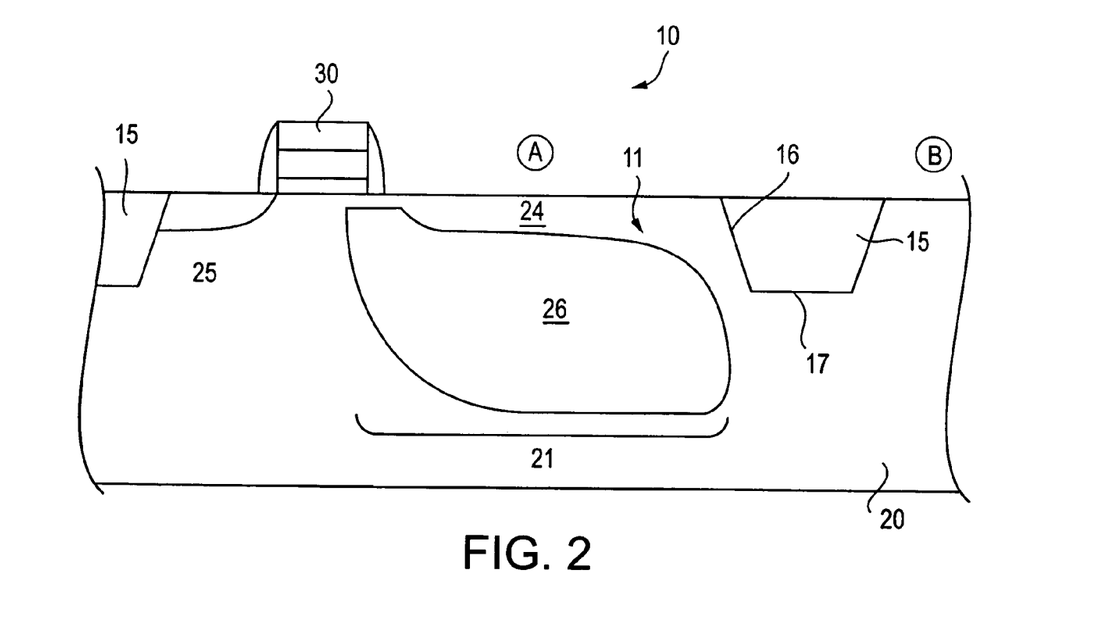
FIG. 2 is a schematic cross-sectional view of the CMOS image sensor of FIG. 1 taken along line 2-2'.

CMOS imagers are known in the art. A top-down view of a semiconductor wafer fragment of an exemplary CMOS sensor pixel four-transistor (4T) cell 10 is illustrated in FIG. 1. As it will be described below, the CMOS sensor pixel cell 10 includes a photo-generated charge accumulating area 21 in an underlying portion of the substrate. This area 21 is formed as a pinned diode 11 (FIG. 2). The pinned photodiode is termed "pinned" because the potential in the photodiode is pinned to a constant value when the photodiode is fully depleted. It should be understood, however, that the CMOS sensor pixel cell 10 may include a photogate or other image to charge converting device, in lieu of a pinned photodiode, as the initial accumulating area 21 for photo-generated charge.

The CMOS image sensor 10 of FIG. 1 has a transfer gate 30 for transferring photoelectric charges generated in the charge accumulating region 21 to a floating diffusion region (sensing node) 25. The floating diffusion region 25 is further connected to a gate 50 of a source follower transistor. The source follower transistor provides an output signal to a row select access transistor having gate 60 for selectively gating the output signal to terminal 32. A reset transistor having gate 40 resets the floating diffusion region 25 from a supply voltage applied at a source/drain region between gates 40 and 50 to a specified charge level before each charge transfer from the charge accumulating region 21.

A cross-sectional view of the exemplary CMOS image sensor 10 of FIG. 1 taken along line 2-2' is illustrated in FIG. 2. The charge accumulating region 21 is formed as a pinned photodiode 11 which has a photosensitive or p-n-p junction region formed by a p-type layer 24, an n-type region 26 and the p-type substrate 20. The pinned photodiode 11 includes two p-type regions 20, 24 so that the n-type photodiode region 26 is fully depleted at a pinning voltage. Impurity doped source/drain regions 22 (FIG. 1), preferably having n-type conductivity, are provided on either side of the transistor gates 40, 50, 60. The floating diffusion region 25 adjacent the transfer gate 30 is also preferably n-type.

Generally, in CMOS image sensors such as the CMOS image sensor cell 10 of FIGS. 1-2, incident light causes electrons to collect in region 26. A maximum output signal, which is produced by the source follower transistor having gate 50, is proportional to the number of electrons to be extracted from the region 26. The maximum output signal increases with increased electron capacitance or acceptability of the region 26 to acquire electrons. The electron capacity of pinned photodiodes typically depends on the doping level of the image sensor and the dopants implanted into the active layer.

FIG. 2 also illustrates trench isolation regions 15 formed in a substrate layer 20 in which the charge accumulating region 21 is formed. The substrate layer 20 may be an epitaxial layer provided over a silicon base layer. The trench isolation regions 15 are typically formed using a conventional STI process or by using a Local Oxidation of Silicon (LOCOS) process. Trench isolation regions 15 provide a physical barrier between adjacent pixels and help isolate pixels optically and electrically from one another. For example, as shown in FIG. 2, trench isolation region 15 provides surface electrical isolation of the pinned photodiode 11 of pixel region A from the photosensitive elements of adjacent pixel region B.

Another problem associated with the formation of the above-described trench isolation regions 15 is that, when ions are implanted in the substrate close to bottom 17 and edges or sidewalls 16 (FIG. 2) of the trench, current leakage can occur at the junction between the active device regions and the trench. In addition, the dominant crystallographic planes along the bottom 17 and sidewalls 16 of the trench isolation regions 15 have a higher silicon density than the adjacent silicon substrate and, therefore, create a high density of trap sites along the trench bottom 17 and sidewalls 16. These trap sites are normally uncharged but become charged when electrons and holes become trapped in the trap sites. As a result of these trap sites formed along the bottom 17 and sidewalls 16 of the trench isolation regions 15, current generation near and along the trench bottom 17 and sidewalls 16 can be very high and can reduce the photogenerated charge otherwise available from light captured by the photodevice. Current generated from trap sites inside or near the photodiode depletion region also causes undesired dark current.

Minimizing dark current in the photodiode is important in CMOS image sensor fabrication. Dark current is generally attributed to leakage in the charge collection region 21 of the pinned photodiode 11, which is strongly dependent on the doping implantation conditions of the CMOS image sensor. In addition and as explained above, defects and trap sites inside or near the photodiode depletion region strongly influence the magnitude of dark current generated. In sum, dark current is a result of current generated from trap sites inside or near the photodiode depletion region, surface leakage at silicon/surface interface; band-to-band tunneling induced carrier generation as a result of high fields in the depletion region; junction leakage coming from the lateral sidewall of the photodiode; and leakage from isolation corners, for example, stress induced and trap assisted tunneling.

CMOS imagers also typically suffer from poor signal to noise ratios and poor dynamic range as a result of the inability to fully collect and store the electric charge collected in the region 26. Since the size of the pixel electrical signal is very small due to the collection of photons in the photo array, the signal to noise ratio and dynamic range of the pixel should be as high as possible.

There is needed, therefore, an improved CMOS imager that exhibits reduced pixel spacing between adjacent pixel sensor cells, reduced cross-talk and blooming, as well as reduced dark current and increased photodiode capacitance. There is also needed an isolation region for a CMOS imager and that (i) has minimum width to increase the pixel fill factor (pixel density) while providing electrical and physical separation between photosensitive elements of adjacent pixels of the CMOS imager; (ii) prevents current generation or current leakage; and (iii) acts as a reflective barrier to electrons generated by light absorption in a photodiode back to the charge collection region of the photodiode of a pixel sensor cell.

A method of fabricating active pixel photosensors exhibiting these improvements is also needed, as well as an isolation technique that eliminates dark current and reduces cross-talk between adjacent pixel sensor cells of a CMOS imager.

BRIEF SUMMARY OF THE INVENTION

In one aspect, the invention provides a barrier implanted region of a first conductivity type formed in lieu of an isolation region of a pixel sensor cell that provides physical and electrical isolation of photosensors of adjacent pixel sensor cells of a CMOS imager. The barrier implanted region comprises a first region having a first width and a second region located below the first region and having a second width greater than the first width. The first region is laterally spaced from doped regions of a second conductivity type of adjacent photodiodes of pixel sensor cells of a CMOS imager. The first region has a width of less than about 0.4 microns, preferably of less than about 0.2 microns, which provides minimum spacing between elements of adjacent pixel cells, such as between photosensors of adjacent pixel cells, and improves the pixel density of the CMOS imager.

The second region of the barrier implanted region is located below and in contact with the first region and has a width greater than the first width, of about 0.6 to about 1.2 microns, more preferably of about 0.8 microns. The first and second regions of the barrier implanted region are formed by conducting a plurality of implants of the first conductivity type at different energies and doping levels below the substrate surface.

In another aspect, the invention provides a method of forming a barrier implanted region below a substrate surface of a CMOS imager and adjacent photosensors of pixel sensor cells. The barrier implanted region is formed by (i) conducting a first implant to form a first implanted region having a first width of less than about 0.4 microns, preferably of less than about 0.2 microns, below the substrate surface; and (ii) conducting a second implant to form a second implanted region below the first implanted region and having a second width of about 0.6 to about 1.2 microns, more preferably of about 0.8 microns.

These and other features and advantages of the invention will be more apparent from the following detailed description that is provided in connection with the accompanying drawings and illustrated exemplary embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-sapphire, germanium, or gallium arsenide, or other semiconductor materials.

The term "pixel" refers to a picture element unit cell containing a photosensor and transistors for converting electromagnetic radiation to an electrical signal. For purposes of illustration, portions of representative pixels are illustrated in the figures and description herein and, typically, fabrication of all imager pixels in an imager will proceed simultaneously in a similar fashion.

The term "minimally spaced" refers to the minimal distance between at least two adjacent pixels spaced from one another in accordance with the embodiments of the present invention. For purposes of the present invention, the term "minimally spaced" refers to a distance of less than about 0.4 microns, preferably of less than about 0.2 microns.

Figure 7:
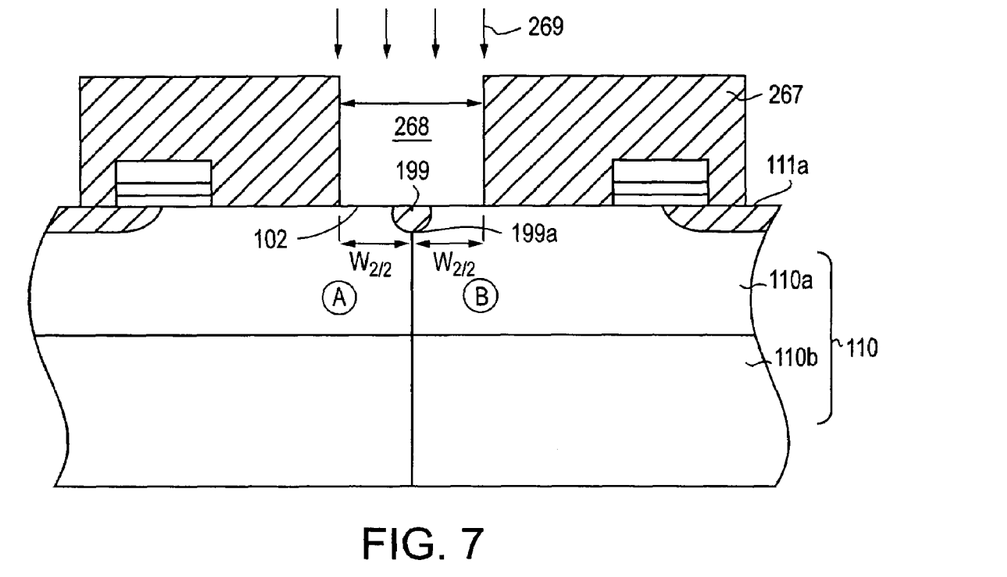
FIG. 7 is a schematic cross-sectional view of the CMOS image sensor pixel of FIG. 3 at a stage of processing subsequent to that shown in FIG. 6.
Figure 8:
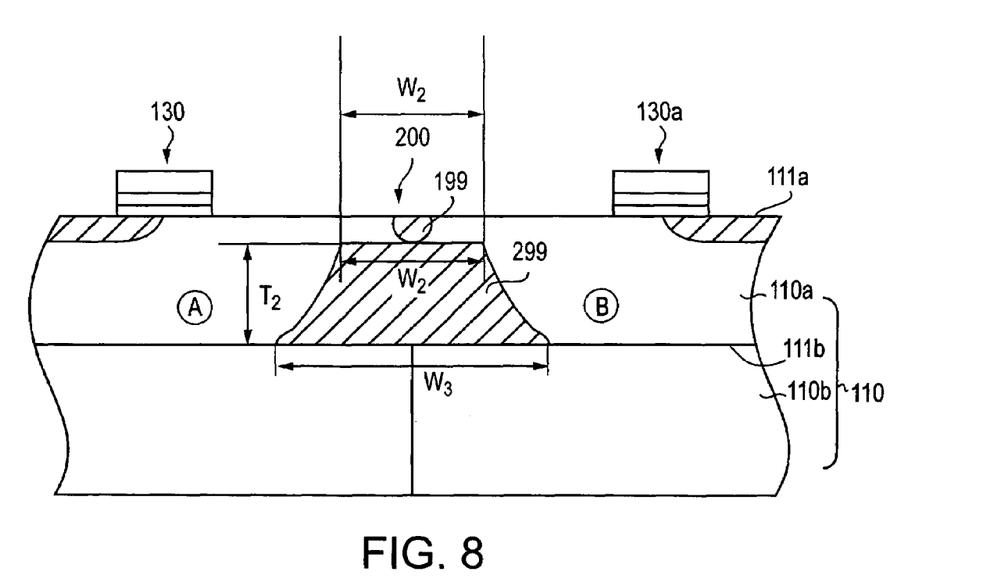
FIG. 8 is a schematic cross-sectional view of the CMOS image sensor pixel of FIG. 3 at a stage of processing subsequent to that shown in FIG. 7.
Figure 9:
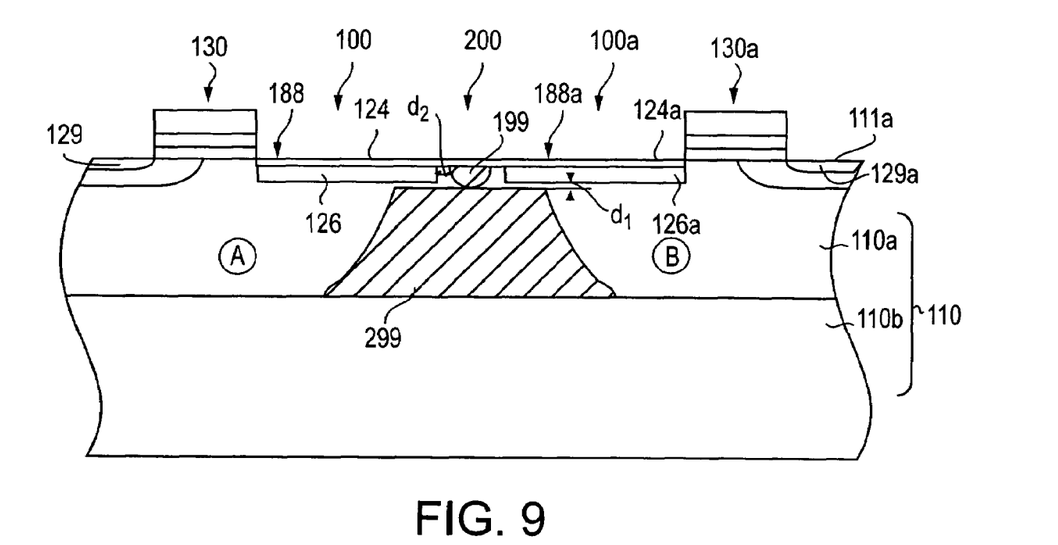
FIG. 9 is a schematic cross-sectional view of the CMOS image sensor pixel of FIG. 3 at a stage of processing subsequent to that shown in FIG. 8.

Referring now to the drawings, where like elements are designated by like reference numerals, FIGS. 3-9 illustrate exemplary embodiments of methods of forming barrier implanted region 200 located below the surface of substrate 110 and adjacent charge collection regions 126, 126a of photosensors formed as photodiodes 188, 188a, of adjacent four-transistor (4T) pixel sensor cells 100, 100a (FIG. 9). As explained in detail below, the barrier implanted region 200 is formed by implanting dopants of a first conductivity type at different energies and/or dosages below the surface of p-type epitaxial (epi) layer 110a to form a first implanted region 199 having a first width, and a second implanted region 299 having a second width greater than the first width. The second implanted region 299 is located below the first implanted region and connects the first implanted region to the upper surface of P+ substrate 110b, providing therefore reduced cross-talk between adjacent pixels and reduced blooming.

It should be noted that, although the invention will be described below in connection with use in a four-transistor (4T) pixel cell, the invention also has applicability to any CMOS imager including, for example, a three-transistor (3T) cell which differs from the 4T cell in the omission of a charge transfer transistor, and to pixel cells having more than four transistors.

Figure 3:
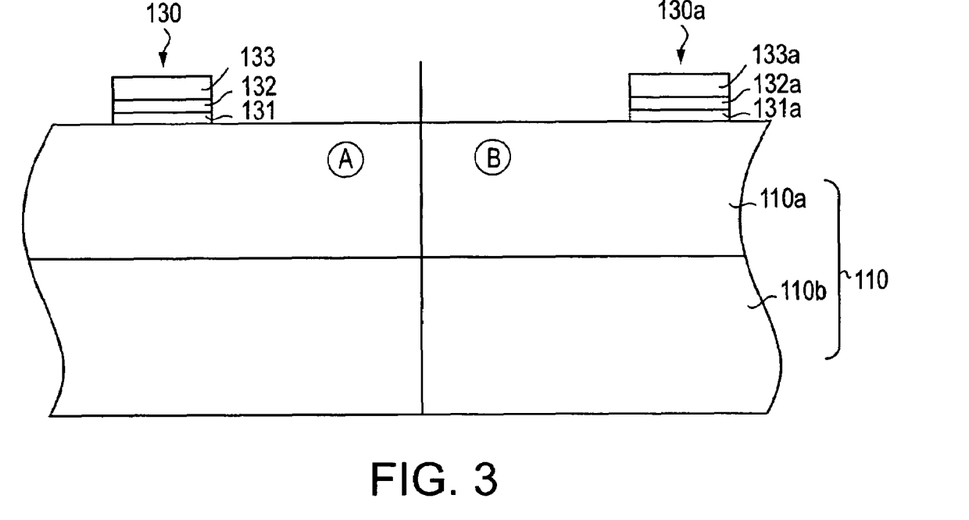
FIG. 3 is a schematic cross-sectional view of a CMOS image sensor pixel illustrating the fabrication of a barrier implanted region in accordance with the present invention and at an initial stage of processing.

FIGS. 3-9 illustrate a substrate 110 along a cross-sectional view which is the same view as in FIG. 2. For exemplary purposes, FIGS. 3-9 illustrate the substrate 110 as comprising an epitaxial layer supported by a base semiconductor. If a p+ epitaxial substrate layer is desired, a p-type epitaxial (epi) layer 110a (FIG. 3) is formed over a highly doped P+ substrate 110b, as illustrated in FIG. 3. The p-type epitaxial layer 110a may be formed to a thickness of about 2 microns to about 12 microns, more preferably of about 2 microns to about 7 microns, and may have a dopant concentration in the range of about $1\times10^{14}$ to about $5\times10^{16}$ atoms per cm$^3$, more preferably of about $5\times10^{14}$ to about $5\times10^{15}$ atoms per cm$^3$. The P+ substrate 110b is a highly doped substrate with an electrical resistivity of about 0.001 Ω-cm to about 1 Ω-cm, more preferably of about 0.01 Ω-cm to about 0.1 Ω-cm.

FIG. 3 also illustrates multi-layered transfer gate stacks 130, 130a formed over the p-type epitaxial layer 110a, each corresponding to first and second adjacent pixel regions A and B, respectively. The elements of the transfer gate stack 130 are similar to those of the transfer gate stack 130a and thus, for simplicity, a description of only the elements of the gate stack 130 is provided below.

The transfer gate stack 130 comprises a first gate oxide layer 131 of grown or deposited silicon oxide on the p-type epitaxial layer 110a, a conductive layer 132 of doped polysilicon or other suitable conductor material, and a second insulating layer 133, which may be formed of, for example, silicon oxide (silicon dioxide), nitride (silicon nitride), oxynitride (silicon oxynitride), ON (oxide-nitride), NO (nitride-oxide), or ONO (oxide-nitride-oxide). The first and second insulating layers 131, 133 and the conductive layer 132 may be formed by conventional deposition and etching methods, for example, blanket chemical vapor deposition (CVD) or plasma enhanced chemical vapor deposition (PECVD), followed by a patterned etch, among many others.

If desired, a silicide layer (not shown) may be also formed in the multi-layered gate stack 130, between the conductive layer 132 and the second insulating layer 133. Advantageously, the gate structures of all other transistors in the imager circuit design may have this additionally formed silicide layer. This silicide layer may be titanium silicide, tungsten silicide, cobalt silicide, molybdenum silicide, or tantalum silicide. The silicide layer could also be a barrier layer/refractory metal such as TiN/W or WN$_x$/W or it could be entirely formed of WN$_x$.

Figure 4:
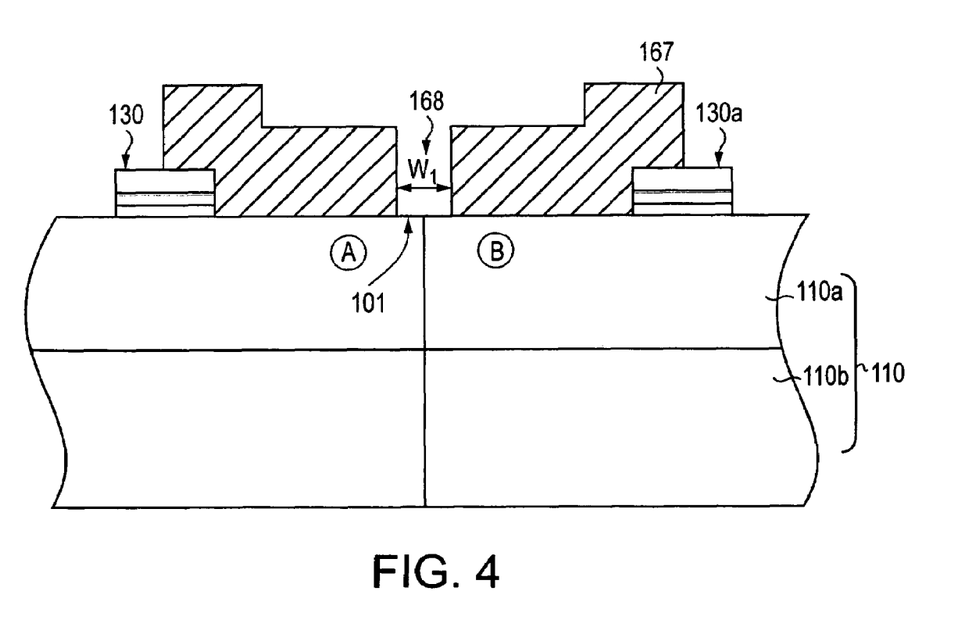
FIG. 4 is a schematic cross-sectional view of the CMOS image sensor fragment of FIG. 3 at a stage of processing subsequent to that shown in FIG. 3 and in accordance with an embodiment of the present invention.
Figure 5:
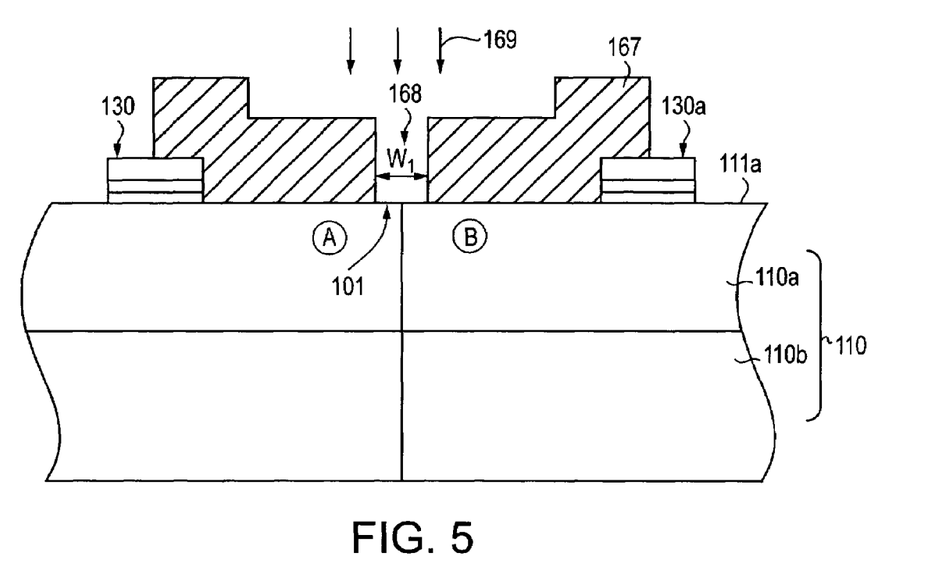
FIG. 5 is a schematic cross-sectional view of the CMOS image sensor pixel of FIG. 3 at a stage of processing subsequent to that shown in FIG. 4.

Reference is now made to FIG. 4. Subsequent to the formation of the gate stacks 130, 130a, a first photoresist layer 167 is formed over the structure of FIG. 3 to a thickness of about 1,000 Angstroms to about 50,000 Angstroms. The first photoresist layer 167 is patterned to obtain a first opening 168 over an area 101 (FIG. 4) of the p-type epitaxial layer 110a between the adjacent pixels where a first implanted region will be formed in accordance with an embodiment of the present invention. As illustrated in FIG. 4, the first photoresist layer 167 is patterned so that, on one side of the first opening 168, the photoresist layer 167 extends by a distance "$W_1/2$" within each of the first and second pixel regions A and B. Preferably, the distance $W_1$ is of less than about 0.4 microns, more preferably less than about 0.2 microns, which represents the width $W_1$ of the first implanted region 199 (FIG. 6).

Next, the structure of FIG. 4 is subjected to a first dopant implantation 169 (FIG. 5) with a dopant of the first conductivity type, which for exemplary purposes is p-type. This way, p-type ions are implanted through opening 168 and into area 101 of the p-type epitaxial layer 110a to form a first p-type well region 199 (or a first implanted region 199), as illustrated in FIG. 6. The first p-type well region 199 extends below surface 11a of the p-type epitaxial layer 110a, and is located adjacent active areas A and B of the substrate 110 where two adjacent photodiodes are to be formed, as will be described below. The depth into the substrate 110, shown as thickness $T_1$ (FIG. 6), of the first p-type well region 199 is of about 0.5 to about 2 microns, more preferably of about 1 micron.

Figure 6:
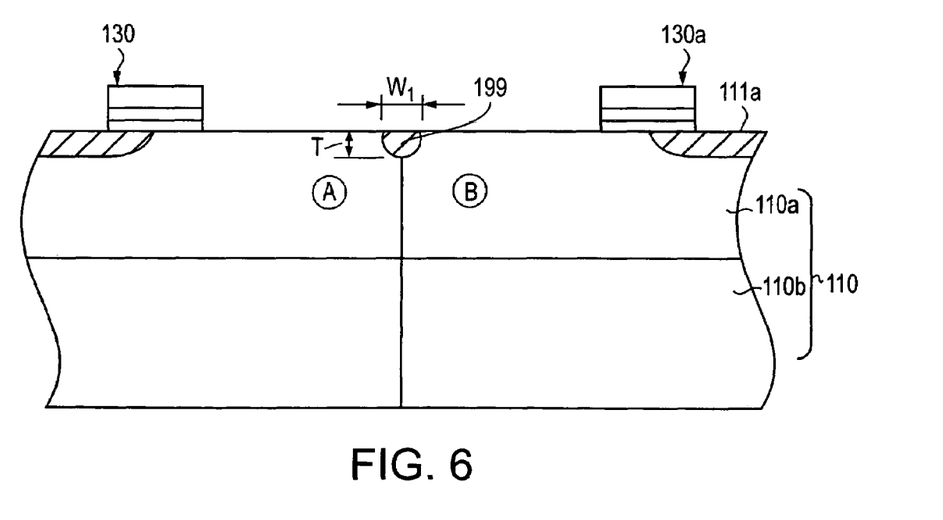
FIG. 6 is a schematic cross-sectional view of the CMOS image sensor pixel of FIG. 3 at a stage of processing subsequent to that shown in FIG. 5.

The dopant implantation 169 is conducted to implant p-type ions, such as boron or indium, into area 101 of the p-type epitaxial layer 110a to form the first p-type well region 199 (FIG. 6). The ion implantation 169 may be conducted at an energy of 50 keV to about 1 MeV, more preferably of about 100 keV to about 500 keV. The implant dose in the first p-type well region 199 is within the range of about $5\times10^{11}$ to about $5\times10^{13}$ atoms per cm$^2$, and is preferably within the range of about $1\times10^{12}$ to about $5\times10^{12}$ atoms per cm$^2$. If desired, multiple implants may be used to tailor the profile of the first p-type well region 199. In addition, the implant or the multiple implants forming the first p-type well region 199 may be angled or used in connection with at least one angled implant.

Subsequent to the formation of the first p-type well region 199 shown in FIG. 6, the first patterned photoresist 167 is removed by conventional techniques, such as oxygen plasma for example. The structure at this point is depicted in FIG. 6.

A second masked dopant implantation is conducted with a dopant of the first conductivity type, which for exemplary purposes is p-type, to implant ions in the area of the substrate directly beneath, and in contact with, the first p-type well region 199 and to form a second p-type well region 299, as illustrated in FIG. 8. For this, a second photoresist layer 267 (FIG. 7) having a thickness of about 13,000 Angstroms to about 100,000 Angstroms is formed over the structure of FIG. 6 and patterned to obtain a second opening 268, as shown in FIG. 7. As illustrated in FIG. 7, the second photoresist layer 267 is patterned so that, on one side of the second opening 268, the photoresist layer 267 extends by a distance "$W_2/2$" within each of the first and second pixel regions A and B. Preferably, the distance $W_2$ is of about 0.6 to about 1.2 microns, more preferably of about 0.8 microns, and represents the upper width $W_2$ of the second implanted region 299 (FIG. 8). As shown, the width $W_2$ of the opening 268 is wider than the width $W_1$ of the opening 168.

The second dopant implantation 269 is conducted to implant p-type ions, such as boron or indium, into area 102 of the p-type epitaxial layer 110a to form the second p-type well region 299 (FIG. 8). The second dopant implantation 269 may be conducted by placing the substrate 110 in an ion implanter and implanting appropriate p-type dopant ions through the opening 268. The ion implantation 269 may be conducted at an energy of 50 keV to about 3 MeV, more preferably of about 200 keV to about 1.5 MeV. The implant dose in the second p-type well region 299 may be the same as or different from the implant dose in the first p-type well region 199. For exemplary purposes only, the implant dose in the second p-type well region 299 is within the range of about $5\times10^{11}$ to about $5\times10^{13}$ atoms per cm$^2$, and is preferably within the range of about $1\times10^{12}$ to about $5\times10^{12}$ atoms per cm$^2$. If desired, multiple implants may be used to tailor the profile of the second p-type well region 299. In addition, the implant or the multiple implants forming the second p-type well region 299 may be angled or used in connection with at least one angled implant.

As illustrated in FIG. 8 and according to an exemplary embodiment, the second p-type well region 299 has a trapezoidal cross-section with upper width $W_2$ of about 0.6 to about 1.2 microns, more preferably of about 0.8 microns, and lower width $W_3$ of about 0.8 to about 1.4 microns, more preferably of about 1.0 micron. However, the invention also contemplates the second p-type well region 299 having other various cross-sectional shapes, for example a rectangular shape, among others. The depth into substrate 110 of the second p-type well region 299, indicated by thickness $T_2$ (FIG. 8), is of about 1.5 to about 12 microns, more preferably of about 5 microns.

Subsequent to the second dopant implantation 269 (FIG. 7), the second photoresist layer 267 is removed by conventional techniques, such as oxygen plasma for example. The structure at this point is depicted in FIG. 8.

Referring now to FIG. 9, elements of photodiodes 188, 188a of four-transistor (4T) pixel sensor cells 100, 100a are next formed adjacent the first and second p-type implant regions 199, 299 of the barrier implanted isolation region 200 of the present invention. Although the invention will be described below with reference to a photodiode as a photosensitive element, the invention is not limited to this exemplary embodiment and contemplates the formation of the implanted region 200 adjacent various photosensitive elements such as photoconductor and photogates, among others.

According to an exemplary embodiment of the invention, each of the photodiodes 188, 188a is a p-n-p photodiode formed by regions 124, 124a, p-type epitaxial layer 110a, and regions 126, 126a, respectively. The n-type region 126, 126a (FIG. 9) is formed by implanting dopants of a second conductivity type, which for exemplary purposes is n-type, in the area of the substrate directly beneath the active areas A and B of the adjacent pixel cells, and adjacent the barrier implanted region 200. As shown in FIG. 9, the n-type region 126, 126a is spaced from the first p-type well region 199 by a distance "$d_2$" of about 10 to about 20 nm in the horizontal direction. Although FIG. 9 illustrates the n-type region 126, 126a slightly spaced from the first p-type well region 199, the invention is not limited to this embodiment and also contemplates the formation of n-type region 126, 126a adjacent and touching the first p-type well region 199 in at least one side.

Further, although FIG. 9 illustrates the n-type region 126, 126a slightly spaced from the second p-type well region 299 by a distance "$d_1$" of about 100 to about 500 nm, more preferably of about 300 nm, in the vertical direction, the invention also contemplates the embodiment according to which the second p-type well region 299 contacts the n-type region 126, 126a in at least one direction (for example, in the vertical direction) or in both vertical and horizontal directions.

The implanted n-doped region 126, 126a forms a photosensitive charge storage region for collecting photogenerated electrons. Ion implantation may be conducted by placing the substrate 110 in an ion implanter, and implanting appropriate n-type dopant ions into the substrate 110 at an energy of 20 keV to 500 keV to form n-doped region 126, 126a. N-type dopants such as arsenic, antimony, or phosphorous may be employed. The dopant concentration in the n-doped region 126, 126a (FIG. 9) is within the range of about $1\times10^{15}$ to about $1\times10^{18}$ atoms per cm$^3$, and is preferably within the range of about $5\times10^{16}$ to about $5\times10^{17}$ atoms per cm$^3$. If desired, multiple implants may be used to tailor the profile of the n-doped region 126, 126a. The implants forming region 126, 126a may also be angled implants, formed by angling the direction of implants toward the gate stack 130, 130a.

Another dopant implantation with a dopant of the first conductivity type, which for exemplary purposes is p-type, is conducted so that p-type ions are implanted into the area of the substrate over the implanted n-type region 126, 126a and between the transfer gate 130, 130a and the barrier implanted region 200, to form a p-type pinned surface layer 124, 124a of the now completed photodiode 188, 188a (FIG. 9).

The p-type pinned surface layer 124, 124a is also formed by conducting a dopant implantation with a dopant of the first conductivity type, which for exemplary purposes is p-type, so that p-type ions are implanted into the area of the substrate over the implanted n-type region 126, 126a and between the transfer gate 130, 130a and the barrier implanted region 200.

FIG. 9 also illustrates n-type floating diffusion region 129, 129a located adjacent the multi-layered gate stack 130, 130a and opposite the n-type doped region 126, 126a of the p-n-p photodiode 188, 188a. This way, the multi-layered transfer gate stack 130, 130a transfers charge accumulated in the charge collection region 126, 126a of the photodiode 188, 188a to the floating diffusion region 129, 129.

The barrier implanted isolation region 200 of FIG. 9 adjacent the n-type region 126, 126a acts as a reflective barrier to electrons generated by light in the n-doped regions 126, 126a of the p-n-p photodiodes 188, 188a. When light radiation in the form of photons strikes the photosite regions 126, 126a, photo-energy is converted to electrons which are stored in the n-doped region 126, 126a. The absorption of light creates electron-hole pairs. For the case of an n-doped photosite in a p-well or a p-type epitaxial layer, it is the electrons that are stored. For the case of a p-doped photosite in an n-well, it is the holes that are stored. Thus, in the exemplary embodiment described above having n-channel devices formed in the p-type epitaxial layer 110a, the carriers stored in the n-doped photosite region 126, 126a are electrons. The barrier implanted isolation region 200 acts to reduce carrier loss to the substrate 110 by forming a concentration gradient that modifies the band diagram and serves to reflect electrons back towards the n-doped photosite region 126, 126a, thereby reducing cross-talk between adjacent pixel sensor cells.

In addition to providing a reflective barrier to electrons generated by light in the charge collection region, the barrier implanted isolation region 200 provides photosensor-to-photosensor isolation, for example, isolation of the p-n-p photodiode 188 from an adjacent photodiode (such as adjacent p-n-p photodiode 188a) located on the other side of the barrier implanted region 200.

In addition to providing a barrier region and photosensor-to-photosensor isolation, the barrier implanted isolation region 200 also eliminates the formation of shallow trench isolation regions and, therefore, the formation of trap sites along the bottom of such shallow trench isolation regions. As a result of eliminating the formation of these trap sites along the bottom of the trench isolation regions, dark current generation and leakage is decreased. The barrier implanted region 200 also "hooks-up" the p-type epitaxial layer 110a to the P+ substrate 110b to minimize cross-talk, and allows for improved pixel scaling.

The remaining devices of the pixel sensor cell 100, 100a, including the reset transistor, the source follower transistor and row select transistor shown in FIG. 1 as associated with respective gates 40, 50 and 60 and source/drain regions on either sides of the gates, are also formed by well-known methods. Conventional processing steps may be also employed to form contacts and wiring to connect gate lines and other connections in the pixel cell 100, 100a. For example, the entire surface may be covered with a passivation layer of, e.g., silicon dioxide, BSG, PSG, or BPSG, which is CMP planarized and etched to provide contact holes, which are then metallized to provide contacts to the reset gate, transfer gate and other pixel gate structures, as needed. Conventional multiple layers of conductors and insulators to other circuit structures may also be used to interconnect the structures of the pixel sensor cell.

Figure 10:
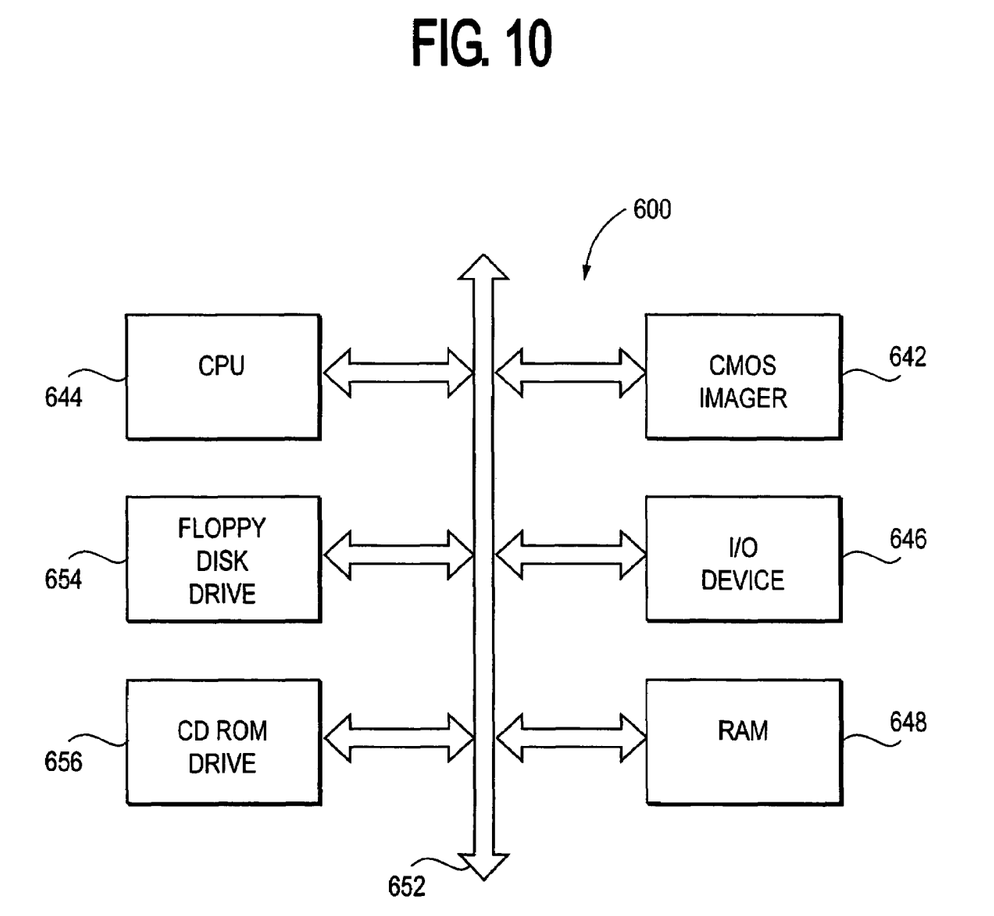
FIG. 10 illustrates a schematic diagram of a computer processor system incorporating a CMOS image sensor fabricated according to the present invention.

A typical processor based system 600, which has a connected CMOS imager 642 having pixels constructed according to the invention is illustrated in FIG. 10. A processor based system is exemplary of a system having digital circuits which could include CMOS image sensors. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 644, for example, a microprocessor, that communicates with an input/output (I/O) device 646 over a bus 652. The CMOS image sensor 642 also communicates with the system over bus 652. The computer system 600 also includes random access memory (RAM) 648, and, in the case of a computer system may include peripheral devices such as a floppy disk drive 654, and a compact disk (CD) ROM drive 656 or a flash memory card 657 which also communicate with CPU 644 over the bus 652. It may also be desirable to integrate the processor 654, CMOS image sensor 642 and memory 648 on a single IC chip.

Although the above embodiments have been described with reference to the formation of photosensors as p-n-p photodiodes of adjacent pixel cells, such as the p-n-p photodiode 188, 188a (FIG. 9) having n-type charge collection regions 126, 126a formed adjacent p-type barrier implanted region 200, it must be understood that the invention is not limited to this embodiment. Accordingly, the invention has equal applicability to other photosensors including n-p-n photodiodes comprising p-type charge collection regions formed adjacent an n-type barrier implanted region, photogates and other types of photosensors. Of course, the dopant and conductivity type of all structures will change accordingly, with the transfer gate corresponding to a PMOS transistor. Further, although the embodiments of the present invention have been described above with reference to a p-n-p photodiode, the invention also has applicability to n-p or p-n photodiodes.

In addition and as noted above, although the invention has been described with reference to the formation of only one barrier implanted isolation region 200 isolating charge collection regions of photosensitive elements of adjacent pixel sensor cells, the invention also contemplates the formation of a multitude of such barrier implanted regions located at various locations on the substrate to isolate pixels. Further, although the invention has been described above with reference to a transfer gate of a transfer transistor connection for use in a four-transistor (4T) pixel cell, the invention also has applicability to a five-transistor (5T) pixel cell, a six-transistor (6T) pixel cell, or a three-transistor (3T) cell, among others.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming pixel sensor cells, said method comprising:
   providing a first doped layer of a first conductivity type in a substrate;
   forming at least one barrier implanted isolation region in said doped layer to isolate said pixel sensor cells, said barrier implanted isolation region comprising a first well region of a first width and a second well region of a second width greater than the first width, the second well region being located below and in contact with the first well region;
   forming at least two charge collection regions of a second conductivity type in said first doped layer, said charge collection regions being adjacent said barrier implanted isolation region; and
   forming at least two second doped layers of said first conductivity type in said substrate above each of said charge collection regions.

2. The method of claim 1, wherein said first doped layer is a p-type epitaxial layer.

3. The method of claim 1, wherein said first well region is formed to a width of less than about 0.4 microns.

4. The method of claim 3, wherein said first well region is formed to a width of less than about 0.2 microns.

5. The method of claim 1, wherein said second well region is formed to a width of about 0.6 to about 1.2 microns.

6. The method of claim 5, wherein said second well region is formed to a width of about 0.8 microns.

7. The method of claim 1, wherein said first well region is formed to a thickness of about 0.5 to about 2 microns.

8. The method of claim 7, wherein said first well region is formed to a thickness of about 1 micron.

9. The method of claim 1, wherein said second well region is formed to a thickness of about 1.5 to about 12.0 microns.

10. The method of claim 9, wherein said second well region is formed to a thickness of about 5 microns.

11. The method of claim 1, wherein said first well region is doped with a p-type dopant at a dopant concentration of from about $5\times10^{11}$ to about $5\times10^{13}$ atoms per $cm^2$.

12. The method of claim 11, wherein said first well region is doped with a p-type dopant at a dopant concentration of about $1\times10^{12}$ to about $5\times10^{12}$ atoms per $cm^2$.

13. The method of claim 1, wherein said second well region is doped with a p-type dopant at a dopant concentration of from about $5\times10^{11}$ to about $5\times10^{13}$ atoms per $cm^2$.

14. The method of claim 13, wherein said second well region is doped with a dopant at a dopant concentration of about $1\times10^{12}$ to about $5\times10^{12}$ atoms per $cm^2$.

15. The method of claim 1, wherein pixel sensor cells are spaced from each other by less than 0.4 microns.

16. The method of claim 15, wherein pixel sensor cells are spaced from each other by less than 0.2 microns.

* * * * *